United States Patent [19]

Swanson

[11] Patent Number: 5,241,306
[45] Date of Patent: Aug. 31, 1993

[54] SYSTEM AND METHOD FOR INTRODUCING METER SENSOR HYSTERESIS

[75] Inventor: Scott C. Swanson, Roswell, Ga.

[73] Assignee: Schlumberger Industries, Inc., Norcross, Ga.

[21] Appl. No.: 741,007

[22] Filed: Aug. 6, 1991

[51] Int. Cl.[5] .............................................. G08C 19/16
[52] U.S. Cl. .......................... 340/870.29; 340/870.02; 340/870.28; 324/96; 250/231.13
[58] Field of Search ............... 340/870.02, 870.28, 340/870.29; 324/157, 96, 137, 175; 250/231.13, 231.17; 364/483

[56] References Cited

U.S. PATENT DOCUMENTS

| | | | |
|---|---|---|---|
| 4,137,451 | 1/1979 | Einolf, Jr. | 340/820.29 X |
| 4,327,362 | 4/1982 | Hoss | 340/870.02 |
| 4,827,123 | 5/1989 | Gray | 250/231.14 |
| 5,089,771 | 2/1992 | Tanguay et al. | 250/231.13 X |

Primary Examiner—Donald J. Yusko
Assistant Examiner—Michael Horabik
Attorney, Agent, or Firm—Sanford J. Asman

[57] ABSTRACT

A method and system for accurate remote reading of an electricity meter including an optical detection arrangement, including a light emitter and sensor, have positioned in the light path therebetween a cutout portion of the meter shaft. Rotation of the shaft affects the amount of light passed to the sensor. Registration errors which may occur in a linear transition operating range are avoided by provision of detector threshold hysteresis. A microprocessor sets timing pulses for emitter energization, establishes a detection period of uniform length of time for each energizing pulse and produces, during each detection period, a digital signal having a logic level indicative of the presence or absence of light transmitted to said sensor, whereby a correlation between light transitions and power usage can be made. Accuracy of detection is improved under microprocessor control by introducing hysteresis in the delay between emitter energization and detection, in the voltage threshold in a comparator connected to the detection circuit, or in emitter energization driving current. The hysteresis is determined in accordance with the memorized state of the last previous detected signal.

19 Claims, 3 Drawing Sheets

SYSTEM AND METHOD FOR INTRODUCING METER SENSOR HYSTERESIS

TECHNICAL FIELD

The present invention relates to remote reading of electricity meters. More particularly, the invention is directed to a method and system for sensing rotation of the shaft of an electricity meter whereby registration of false meter rotor movement is eliminated.

BACKGROUND ART

Electricity meter reading technology has developed in recent years to include, in addition to traditional manual reading of a meter dial, a capability for remote reading. In a customary remote reading arrangement, optical sensing of the meter rotor is performed. A disk on the rotor shaft, which rotates at a rate proportional to power usage, conventionally may contain an aperture near its periphery, the disk acting as a shutter between a light emitting diode and a photosensor. The aperture occupies a set portion of the total disk area within the travel path of the optical sensor.

During travel of the aperture through the path of the optical sensing area, illumination of the photosensor occurs, whereby a voltage threshold in the sensing circuit, set to correspond to the light exposure condition, is exceeded. The non-aperture portion of the disk blocks such light transmission and the sensing circuit does not exceed the voltage threshold during non-exposure. Transition between the dark condition and light saturation of the detector is relatively abrupt and finite.

For each revolution, the sensing circuit should provide at least two transitions between signal logic levels, in correspondence to passage through the light path, in succession, of a non-apertured portion of the disk, the apertured portion, and again a non-apertured portion. The detector circuit counts the transitions and correlates the count with the number of shaft revolutions to obtain a measure of power usage. Signals representing such measurement are communicated by way of telephone lines or data lines to a remote power company location.

In an alternative arrangement, the rotor disk is provided with a darkened light absorbing area instead of an aperture. Light is emitted onto the rotor disk and is either reflected from the non-darkened area of the disk to the detector or absorbed by the darkened area. Power usage is determined similarly by correlating a count of transitions sensed by the detector circuit. A meter reading scheme using such a variation is disclosed in U.S. Pat. No. 4,327,362, issued to Hoss on Apr. 27, 1982. Amplification of the detected signal is compared with a voltage reference, the comparator output being buffered and applied to a counter. Hoss includes a hysteresis circuit for providing a bilevel comparator reference voltage to overcome errors which might be created at the boundaries of the darkened area. Such errors may result from attenuation of light in the course of transmission, a possibility with the use of a low power source, and presence of spurious signals produced by noise and varying ambient temperatures which change component characteristics.

Detection by conventional optical sensor electricity meter systems during periods of low power usage, when the disk is moving slowly or is stationary, is subject to inaccuracy due to false registration errors that are not as likely to occur at other times. Disk transition zones between light and dark, include regions wherein the detector operates in a linear manner; that is, between light saturation and total absence of light. Linear detector operation transpires when an optical shutter partially blocks the sensor at the borders of the darkened light absorbing areas. At such times the conducting current in the sensing phototransistor is proportional to the amount of light to which the phototransistor is exposed. Mechanical vibration or electrical noise occurring when the disk is positioned at such operating zones can cause the detector falsely to sense alternate light and dark conditions. When the rotor is relatively stationary, a tendency for the rotor to creep backwards even a small amount may register false disk movement.

Such problems have been addressed in the past by providing a plurality of sensors offset in the disk path of travel. Two sensors are positioned to have outputs logically interconnected to register the disk aperture shutter passing both of the sensors but not to register the shutter alternating within one of the sensors. Such an arrangement would ensure that registration of a transition occurs only if the disk traverses a predetermined minimum distance of travel. An example of a multiple sensing arrangement is disclosed in U.S. Pat. No. 4,827,123, issued to Gray on May 2, 1989.

The provision of multiple sensors introduces cost and design disadvantages. There must be at least two emitters, two detectors or two of each. Additional electronics is required to interface with an existing single optical sensor system.

Another prior art approach is to apply the detector output of a single sensor system to a comparator having positive feedback or a Schmitt trigger having predefined threshold hysteresis. The Hoss patent, previously identified, exemplifies use of hysteresis in the comparator circuit.

Hysteresis in a logic gate or comparator is the ability to have a low threshold for a falling input signal and high threshold for a rising input signal. In order to function in this manner, the gate must have a memory of the previous state of the input signal. In the Hoss circuit, for example, electrical hysteresis is provided by supplying a comparator with positive feedback from an output to a non-inverting input through a feedback resistor to form a latch or gate circuit. The input signal to the comparator is thus reinforced by the output signal. Thus, the comparator "remembers" the last input state until the input signal swings far enough in the opposite direction to overcome the feedback signal supplied at the input of the comparator. Such operation requires the optical emitter to be energized nearly continuously and several stages of amplification for this purpose. Otherwise, the voltage level applied to the input of the comparator would swing through the dark threshold when the emitter is turned off resulting in an erroneous input being applied to the comparator and causing the comparator to forget its previous state. The power consumption necessary for such emitter energization is, at a minimum, a disadvantage and in some cases intolerable.

A further disadvantage of the prior art systems is the small transition zone between the light saturation and dark regions. The hysteresis introduced by the Hoss circuit, intended to correct for errors that result from attenuation of light in the course of transmission, will be insufficient to cope with many instances of mechanical vibration and reverse creep of the disk as the disk sensor is in the linear operation region of the detector for a very small percentage of a disk revolution. In a narrow zone of linear operation, there is a relatively large change in the amount of light to which the sensor is exposed for a small increment of shaft rotation. Such change can exceed the amount for which the hysteresis voltage threshold can compensate.

DISCLOSURE OF THE INVENTION

Accordingly, an object of the invention is to provide a remote electricity meter optical reading capability having a high reliability during periods of low power usage.

Another object of the invention is to reduce power consumption in an optical meter reading arrangement while providing hysteresis thresholds in the linear ranges of detector operation.

Yet another object of the invention is to minimize the number of sensing elements and to simplify the detector circuit of an optical meter reading system while providing error free detection.

The above and other objects of the invention are satisfied in part by providing an electricity meter reading system having a single sensor arrangement which includes a cutout portion on the rotor shaft rather than a sensing area at a peripheral tract on the disk. The portion of the shaft which includes the cutout is positioned between the light emitter and sensor. Transition between light saturation of the sensor and a total dark condition is gradual, whereby a large range of linear operation is provided.

The system is under the supervision of a microprocessor which controls non-continuous emitter energization at a pulsed rate and duty cycle which is sufficient to accommodate proper sensing of the meter rotor at its highest rate of rotation. During a substantial portion of the cycle the emitter is de-energized, the microprocessor thereby providing minimum power consumption for emitter energization. The detector output signal is applied to the microprocessor which establishes a time delay between the start of the emitter energization pulse and the start of a finite period in which the detector signal is read.

The microprocessor also controls reading threshold hysteresis. The hysteresis memory of the previous state of the input signal resides within the memory of the controlling microprocessor, eliminating the need to provide a positive feedback signal at a comparator input. The hysteresis memory is thereby set, not by the current state of the sensed signal, but by the last earlier sensed signal. The increased linear operation range, obtained by the shaft cutout shutter structure, permits the microprocessor to achieve input signal hysteresis in several ways.

In a first hysteresis control scheme according to the invention, the time delay between emitter energization and detector reading is changed in accordance with the condition of the last previous detected signal. If the previous signal indicated light, the detector is allowed a longer time to respond to the emitter before being read. If the previous signal indicated dark, the detector is allowed a shorter time to respond to the emitter before being read. Such compensation has the effect, in the linear operating range, of extending the digital threshold range by causing a light sensing indication to tend to remain in a light sensing state and causing a dark sensing indication to tend to remain in a dark sensing state.

In an alternative arrangement of the invention, a switching gate is interfaced between the detector output and the microprocessor. The threshold of the interface gate is changed to provide hysteresis, depending on the last signal state memorized by the microprocessor. If the previous signal was high, indicating dark, the threshold is set to a low value. If the previous signal was low, indicating light, the threshold is set to a high value. In a variation of this arrangement the microprocessor can select between two sensor interface gates of different thresholds instead of changing the threshold of a single interface gate.

In yet another arrangement of the invention, the microprocessor may alter the emitter drive current, and hence the light output, of the optical emitter. If the previous signal indicated light, the emitter is driven at a higher level to provide more light to detector. If the previous signal indicated dark, the emitter is driven at a lower level to provide less light to the detector. The delay time between emitter energization and reading is not varied in this mode of operation.

Additional objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawings and description are to be regarded as illustrative in nature, and not as restrictive.

BEST MODE FOR CARRYING OUT THE INVENTION

Figure 1:
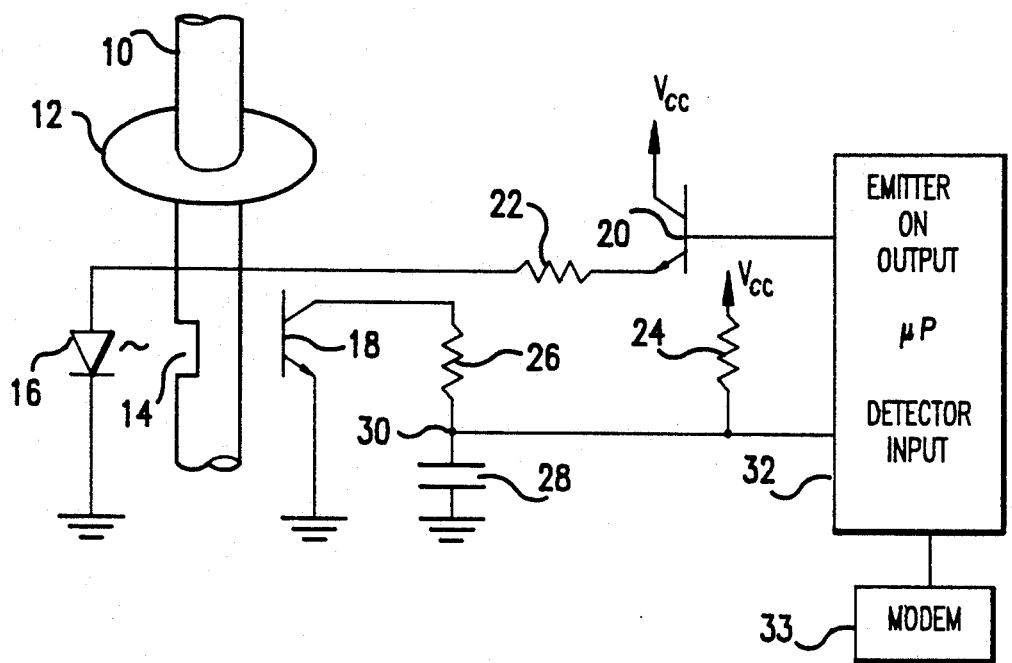
FIG. 1 is a schematic diagram of a first embodiment of an optical meter reading arrangement, according to the invention, illustrating the single sensor unit wherein a cutout region in the meter shaft is positioned in the light path of the sensor unit and further illustrating the hysteresis detection circuit.

FIG. 1 illustrates a first embodiment of the invention. An electricity meter shaft 10 with disk 12 affixed thereto is provided with cutout 14 in the shape of a slot extending through the shaft in a direction perpendicular to the shaft axis. A sensing unit includes light emitting diode 16 and phototransistor 18 with the cutout portion of the shaft interposed therebetween in the light path. The light emitting diode 16 is connected between a voltage supply $V_{CC}$ and ground through a series connection of switching transistor 20 and resistor 22. The phototransistor 18 is connected between the voltage supply $V_{CC}$ and ground through the series connection of resistors 24 and 26. Capacitor 28 is connected in parallel with the series connection of resistor 26 and phototransistor 18.

An output of microprocessor 32 is connected to supply driving signal pulses to the switching transistor 20. The sensor output voltage, which appears across capacitor 28 at node 30, is directly connected to a detector input terminal of microprocessor 32. In the absence of conduction of phototransistor 18, the capacitor is charged by the voltage supply through resistor 24. This voltage level is indicative of a dark condition. A light condition is indicated when the voltage at node 30 is detected to be below a voltage threshold level.

Figures 2A, 2B, 2C, 2D, 2E:
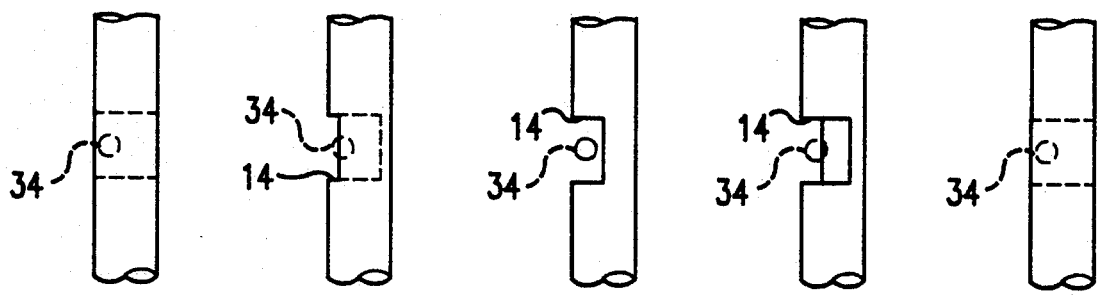
FIGS. 2A through 2E illustrate the shaft cutout portion in the light sensing path for various rotational positions of the shaft.

As the meter shaft rotates the amount of light transmitted between the emitter and phototransistor is dependent upon the position of the cutout portion. FIGS. 2A through 2E illustrate various shaft position angles and the relationship between phototransistor sensing area 34 and cutout 14. In FIG. 2A, the shaft is positioned such that no portion of the cutout faces the sensor and light from the emitter is completely blocked. The phototransistor is nonconductive and the detector indicates a dark condition.

FIG. 2B represents a clockwise rotation of the shaft such that a small portion of the cutout 14 faces the sensor 34. While most of the light path remains blocked, a small amount of light is permitted to pass from the emitter to the sensor. The phototransistor conducts a small current and is operative in the linear range at this time. In FIG. 2C the shaft has rotated further to the point that the entire surface of the sensor 34 is unblocked. The phototransistor is fully conductive and is operative in a saturated mode. At FIG. 2D, further rotation of shaft causes blockage of a small portion of the sensor area and the phototransistor is again in the linear mode of operation. FIG. 2E illustrates a shaft position wherein the entire cutout slot portion faces the photosensor with the shaft again completely blocking light from the emitter.

Figure 3:
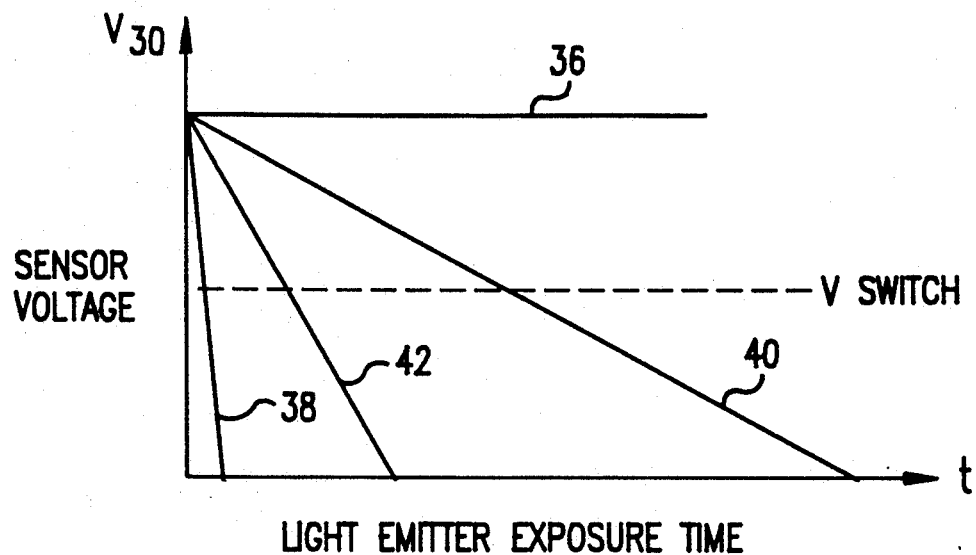
FIG. 3 is a chart depicting sensor output voltage versus time corresponding to the various shaft positions shown in FIGS. 2A through 2E.

The effect of shaft position upon the rate of voltage decay at the sensor output node 30 is shown in FIG. 3. This figure is a plot of sensor output voltage versus emitter energization time for each of a plurality of shaft positions. When the sensor is completely blocked, for example in the shaft positions represented by FIGS. 2A and 2E, phototransistor 18 remains nonconductive and the sensor output voltage remains high as indicated by curve 36. When the sensor is light saturated, as represented by the shaft position shown in FIG. 2C, the phototransistor conducts maximum current and the sensor voltage decays at a maximum rate as indicated by curve 38. Curves 40 and 42 illustrate decay rates for exposures in the linear phototransistor operation range corresponding respectively to the shaft positions shown in FIGS. 2B and 2D. The detector switch threshold voltage level is shown as $V_{SWITCH}$.

In operation, the microprocessor provides driving pulses to transistor 20 so that the emitter is intermittently energized. The frequency of these pulses is sufficiently high to handle the highest meter shaft rotational speed. For each emitter energization pulse, the microprocessor activates a finite read period of the signal present at the detector input terminal. During reading a bilevel logic output signal is produced having states which represent presence or absence of light. If the read sensor voltage is above the switch threshold level, a logic state indicative of the dark condition is produced. If the read sensor voltage is below the switch threshold level, a logic state indicative of the light condition is produced. This digital output signal may be transmitted to a remote location by means of modem 33.

The time delay between the emitter pulse and the start of the read period is made dependent on the state of the sensor signal previously read. If the last signal was dark indicative, the time delay is shorter than if the last signal was light indicative. A shorter time delay provides less time for the capacitor to discharge. By changing the time at which the reading of the decaying sensor signal takes place, the switching threshold is effectively shifted. Adjustment of the time delay provides a hysteresis effect which compensates for vibrations while the shaft is stationary or moving slowly through the linear range. If the previous signal was light indicative, the next reading would tend to be light indicative in the linear range. If the previous signal was dark indicative, the next reading would tend to be dark indicative in the linear range.

Figure 4:
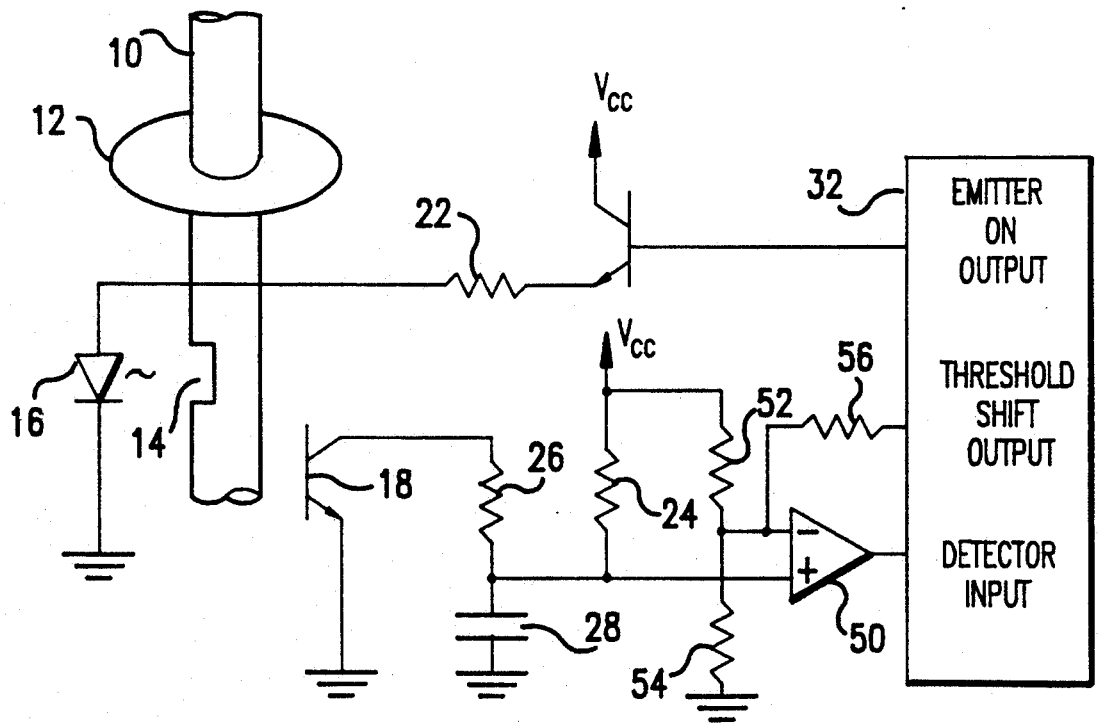
FIG. 4 is a diagram illustrating a second circuit embodiment of the optical hysteresis detector.

FIG. 4 illustrates an alternative embodiment wherein a comparator 50 is interfaced between the sensor output node 30 and the detector input terminal of the microprocessor 32, the sensor output signal being applied to one input of the comparator. The reference input to the comparator is connected to a junction between resistors 52 and 54 which are serially connected between the voltage supply and ground. Change of the switching threshold of the comparator is made under control of the microprocessor by application of a threshold shift output from the microprocessor through resistor 56 to the comparator reference input. If the previous detected signal stored in the microprocessor memory was high, the threshold is set to a low value. If the previous detected signal was low, the threshold is set to a high value. The detected signal in the linear range, therefore, would tend to remain in the same condition.

In this embodiment, a threshold shift is produced at the comparator input in the circuit portion preceding the microprocessor detector. Therefore, the delay period between the emitter energization and the start of the microprocessor detection period does not need to be varied. Instead of changing the threshold of a single comparator, the microprocessor could select between two comparators having different thresholds.

Figure 5:
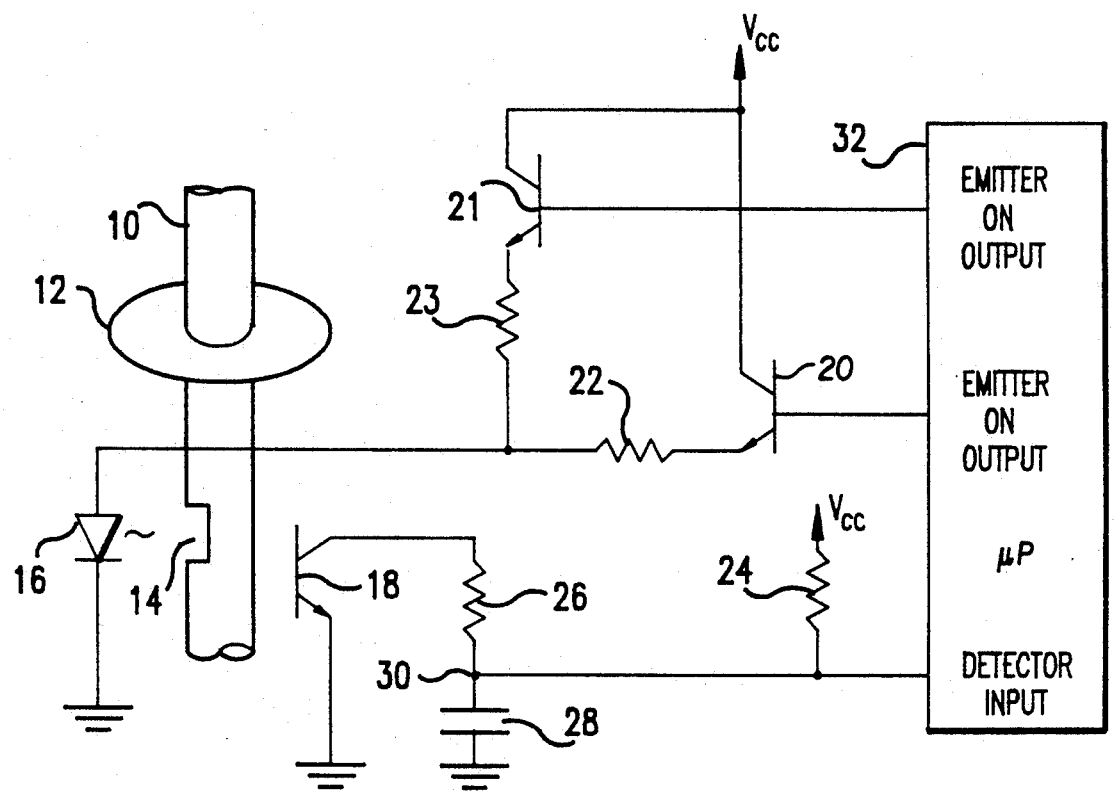
FIG. 5 is a diagram illustrating a third circuit embodiment of the optical hysteresis detector.

In the embodiment shown in FIG. 5, the emitter drive current, and hence the light output, is altered by means of the microprocessor. The emitter is connected to the voltage supply through the series connection of switching transistor 20 and resistor 22 as well as the series connection of switching transistor 21 and resistor 23. Resistors 22 and 23 have different resistance values.

Conduction of either transistor 20 or transistor 21 therefore results in a different emitter drive current. Selection between these transistors for application of the emitter energization pulse is determined by the microprocessor in accordance with the previously read sensor output signal. If the previous signal indicated light, the emitter is driven at a higher current level, to provide more light, than if the previous signal indicated dark. In this manner a hysteresis threshold shift is provided in the linear operating range. This shift may be in lieu of varying the delay between the emitter energization pulse and the detection period.

In summary, there has been disclosed a remote electricity meter arrangement which, through provision of hysteresis threshold shift, avoids false registrations because vibrations or reverse creep of the meter rotor is not apt to cause detection transitions. This effect is enhanced by reason of the increased range of linear operation which results from the cutout shutter structure of the meter shaft. Such structure enables a meter disk rotational hysteresis of up to twenty five degrees.

In this disclosure there is shown and described only the preferred embodiments of the invention and but a few examples of its versatility. It is to be understood that the invention is capable of use in various other combinations and environments and is capable of changes or modifications within the scope of the inventive concept as expressed herein. For example, the voltage switching threshold has been shown, for purposes of illustration, as corresponding to a decay of the sensor output voltage. In a converse arrangement, conduction of the photosensor can be used to charge a sensor output capacitor wherein exceeding the detector voltage threshold would indicate the light condition instead of the dark condition.

What is claimed is:

1. A method for reading a meter including a rotor comprising a shaft and disk affixed thereto, said shaft including a shutter portion including a cutout region, said shutter portion being positioned in a light path between a light emitter and light sensor, comprising the steps of:
   applying energizing pulses to said light emitter;
   generating a sensor output signal in response to said light sensor;
   setting a detection period of uniform length of time for each energizing pulse; and
   producing, during each said detection period, a digital signal having a logic level indicative of the presence or absence of light transmitted to said sensor,
   wherein said step of setting comprises delaying the start of said detection period with respect to the corresponding energizing pulse, and
   the delay in starting the detection period is set in response to the logic level of the digital signal produced during the detection period corresponding to the previous emitter energizing pulse.

2. A method as recited in claim 1, further comprising transmitting said digital signal to a remote location.

3. A method as recited in claim 1, wherein said delay is set to a relatively long time length if the logic level of the last previously produced digital signal is indicative of presence of light at the sensor and the delay is set to a relatively short time length if the logic level of the last previously produced digital signal is indicative of absence of light at the sensor.

4. A method for reading a meter including a rotor comprising a shaft and disk affixed thereto, said shaft including a shutter portion including a cutout region, said shutter portion being positioned in a light path between a light emitter and light sensor, comprising the steps of:
   applying energizing pulses to said light emitter;
   generating a sensor output signal in response to said light sensor;
   setting a detection period of uniform length of time for each energizing pulse;
   producing, during each said detection period, a digital signal having a logic level indicative of the presence or absence of light transmitted to said sensor, and
   setting driving current for said light emitter during each energizing pulse at a level in response to the logic level of the digital signal produced during the detection period corresponding to the previous emitter energizing pulse.

5. A method as recited in claim 4, wherein the level of said driving current is set to a relatively high level if the logic level of the last previously produced digital signal is indicative of presence of light at the sensor and the level of said driving current is set to a relatively low level if the logic level of the last previously produced digital signal is indicative of absence of light at the sensor.

6. A method for detecting motion of a shutter including a cutout region, said shutter being positioned in a light path between a light emitter and light sensor, comprising the steps of:
   applying energizing pulses to said light emitter;
   generating a sensor output signal in response to said light sensor;
   setting a detection period of uniform length of time for each energizing pulse; and
   producing, during each said detection period, a digital signal having a logic level indicative of the presence of absence of light transmitted to said sensor,
   wherein said step of setting comprises delaying the start of said detection period with respect to the corresponding energizing pulse, and
   the delay in starting the detection period is set in response to the logic level of the digital signal produced during the detection period corresponding to the previous emitter energizing pulse.

7. A method as recited in claim 6, wherein said delay is set to a relatively long time length if the logic level of the last previously produced digital signal is indicative of presence of light at the sensor and the delay is set to a relatively short time length if the logic level of the last previously produced digital signal is indicative of absence of light at the sensor.

8. A method for detecting motion of a shutter including a cutout region, said shutter being positioned in a light path between a light emitter and light sensor, comprising the steps of:
   applying energizing pulses to said light emitter;
   generating a sensor output signal in responsive to said light sensor;
   setting a detection period of uniform length of time for each energizing pulse;
   producing, during each said detection period, a digital signal having a logic level indicative of the presence or absence of light transmitted to said sensor, and
   setting driving current for said light emitter during each energizing pulse at a level in response to the logic level of the digital signal produced during the detection period corresponding to the previous emitter energizing pulse.

9. A method as recited in claim 8, wherein the level of said driving current is set to a relatively high level if the logic level of the last previously produced digital signal is indicative of presence of light at the sensor and the level of said driving current is set to a relatively low level if the logic level of the last previously produced digital signal is indicative of absence of light at the sensor.

10. A system for remote reading of a meter, said system comprising
   a meter including a rotor shaft having a disk affixed thereto, said shaft having a portion including a cutout region;

a light emitter;

a light sensor, said portion of the rotor shaft being positioned in a light path between said light emitter and said light sensor to form a light shutter;

energizing means for energizing said light emitter;

circuit means for developing a sensor output voltage in response to said light sensor;

control means for:
a) setting timing pulses for application to said energizing means,
b) setting a detection period of uniform length of time for each energizing pulse; and
c) producing, during each said detection period, a digital signal having a logic level indicative of the presence or absence of light transmitted to said sensor, wherein the start of each said detection period is delayed with respect to the corresponding energizing pulse, and the length of delay in starting the detection period is dependent on the logic level of an earlier produced digital signal.

11. A system for remote reading of a meter, said system comprising a meter including a rotor shaft having a disk affixed thereto, said shaft having a portion including a cutout region;

a light emitter;

a light sensor, said portion of the rotor shaft being positioned in a light path between said light emitter and said light sensor to form a light shutter;

energizing means for energizing said light emitter;

circuit means for developing a sensor output voltage in response to said light sensor;

control means for:
a) setting timing pulses for application to said energizing means,
b) setting a detection period of uniform length of time for each energizing pulse; and
c) producing, during each said detection period, a digital signal having a logic level indicative of the presence or absence of light transmitted to said sensor, wherein said control means comprises a microprocessor having an output terminal connected to said energizing means and a detector input terminal connected to said sensor output voltage, and said energizing means comprises a high current driving means and a low current driving means, one of said high current and low current driving means operatively connected to said emitter during an energizing pulse in dependence upon the logic level of an earlier produced digital signal.

12. A system as recited in claim 11, further comprising comparator means connected between said sensor output voltage and said detector input terminal, said microprocessor setting a voltage threshold of said comparator in response to the logic level of an earlier produced digital signal.

13. A system as recited in claim 11, wherein said high current and low current driving means each comprises a series connection of transistor and resistor, each said driving means connected between a power supply and said light emitter, a control terminal of each transistor connected to an output of said microprocessor.

14. A method for reading a meter including a rotor comprising a shaft and disk affixed thereto, said shaft including a shutter portion including a cutout region, said shutter portion being positioned in a light path between a light emitter and light sensor, comprising the steps of:

applying energizing pulses to said light emitter;

generating a sensor output signal in response to said light sensor;

setting a detection period of uniform length of time for each energizing pulse; and producing, during each said detection period, a digital signal having a logic level indicative of the presence or absence of light transmitted to said sensor, wherein said shutter portion transmits a continuously variable amount of light from said light emitter to said light sensor in proportion to an angular orientation of said shaft, said method including a step of discharging a capacitor at a rate responsive to an intensity of light received by said light sensor during each said detection periods.

15. A method for reading a meter including a rotor comprising a shaft and disk affixed thereto, said shaft including a shutter portion including a cutout region, said shutter portion being positioned in a light path between a light emitter and light sensor, comprising the steps of:

applying energizing pulses to said light emitter;

generating a sensor output signal in response to said light sensor;

setting a detection period of uniform length of time for each energizing pulse; and producing, during each said detection period, a digital signal having a logic level indicative of the presence or absence of light transmitted to said sensor, further including steps of:

charging a capacitor; and discharging said capacitor at a rate responsive to an intensity of light detected by said light sensor, said producing step responsive to a voltage level of said capacitor during each of said detection periods for producing said digital signal.

16. A method for reading a meter including a rotor comprising a shaft and disk affixed thereto, said shaft including a shutter portion including a cutout region, said shutter portion being positioned in a light path between a light emitter and light sensor, comprising the steps of:

applying energizing pulses to said light emitter;

generating a sensor output signal in response to said light sensor;

setting a detection period of uniform length of time for each energizing pulse; and producing, during each said detection period, a digital signal having a logic level indicative of the presence or absence of light transmitted to said sensor, wherein said setting step is responsive to an intensity level of light received by said light sensor from said light emitter for starting a next one of said detection periods.

17. A system for remote reading of a meter, said system comprising a meter including a rotor shaft having a disk affixed thereto, said shaft having a portion including a cutout region;

a light emitter;

a light sensor, said portion of the rotor shaft being positioned in a light path between said light emitter and said light sensor to form a light shutter;
energizing means for energizing said light emitter;
circuit means for developing a sensor output voltage in response to said light sensor;
control means for:
- a) setting timing pulses for application to said energizing means,
- b) setting a detection period of uniform length of time for each energizing pulse; and
- c) producing, during each said detection period, a digital signal having a logic level indicative of the presence or absence of light transmitted to said sensor, wherein said light shutter transmits a continuously variable amount of light from said light emitter to said light sensor in proportion to an angular orientation of said shaft, said system including a capacitor and means for discharging said capacitor at a rate responsive to an intensity of light received by said light sensor during each said detection periods.

18. A system for remote reading of a meter, said system comprising
a meter including a rotor shaft having a disk affixed thereto, said shaft having a portion including a cutout region;
a light emitter;
a light sensor, said portion of the rotor shaft being positioned in a light path between said light emitter and said light sensor to form a light shutter;
energizing means for energizing said light emitter;
circuit means for developing a sensor output voltage in response to said light sensor;
control means for:
- a) setting timing pulses for application to said energizing means,
- b) setting a detection period of uniform length of time for each energizing pulse; and
- c) producing, during each said detection period, a digital signal having a logic level indicative of the presence or absence of light transmitted to said sensor, further including:
a capacitor;
means for charging said capacitor; and
means for discharging said capacitor at a rate responsive to an intensity of light detected by said light sensor,
said producing means being responsive to a voltage level of said capacitor during each of said detection periods for producing said digital signal.

19. A system for remote reading of a meter, said system comprising
a meter including a rotor shaft having a disk affixed thereto, said shaft having a portion including a cutout region;
a light emitter;
a light sensor, said portion of the rotor shaft being positioned in a light path between said light emitter and said light sensor to form a light shutter;
energizing means for energizing said light emitter;
circuit means for developing a sensor output voltage in response to said light sensor;
control means for:
- a) setting timing pulses for application to said energizing means,
- b) setting a detection period of uniform length of time for each energizing pulse; and
- c) producing, during each said detection period, a digital signal having a logic level indicative of the presence or absence of light transmitted to said sensor, wherein said setting means is responsive to an intensity level of light received by said light sensor from said light emitter for starting a next one of said detection periods.

* * * * *